(12) United States Patent
Celii (10) Patent No.: US 7,811,882 B2
(45) Date of Patent: Oct. 12, 2010

(54) HARDMASK MANUFACTURE IN FERROELECTRIC CAPACITORS

(75) Inventor: Francis Gabriel Celii, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 17 days.

(21) Appl. No.: 12/353,172

(22) Filed: Jan. 13, 2009

(65) Prior Publication Data

US 2010/0176427 A1 Jul. 15, 2010

(51) Int. Cl.
 *H01L 21/8242* (2006.01)
(52) U.S. Cl. ............... 438/253; 438/396; 257/E21.648
(58) Field of Classification Search .......... 438/239, 438/240, 253, 396; 257/E21.648
See application file for complete search history.

(56) References Cited

U.S. PATENT DOCUMENTS

| | | | |
|---|---|---|---|
| 6,500,678 B1 | 12/2002 | Aggarwal et al. | |
| 6,569,777 B1 | 5/2003 | Hsu et al. | |
| 7,220,600 B2 | 5/2007 | Summerfelt et al. | |
| 7,250,349 B2 | 7/2007 | Celii et al. | |
| 2004/0043526 A1 | 3/2004 | Ying et al. | |
| 2006/0134808 A1 | 6/2006 | Summerfelt et al. | |
| 2008/0311683 A1* | 12/2008 | Wang | 438/3 |

OTHER PUBLICATIONS

U.S. Appl. No. 12/025,207, filed Feb. 4, 2008, entitled "An Improved Ferroelectric Capacitor Manufacturing Process"; to Francis Gabriel Celii, et al.

* cited by examiner

*Primary Examiner*—Hoai v Pham
(74) *Attorney, Agent, or Firm*—Warren L. Franz; Wade J. Brady, III; Frederick J. Telecky, Jr.

(57) ABSTRACT

A method of manufacturing a semiconductor device. The method comprises fabricating a ferroelectric capacitor. The capacitor's fabrication includes forming conductive and ferroelectric material layers on a semiconductor substrate, forming a hardmask layer on the conductive and ferroelectric material layers, forming an organic bottom antireflective coating layer on the hardmask layer, and, patterning the organic bottom antireflective coating layer. Seasoning in a hardmask etching chamber is substantially unaffected by the patterning.

19 Claims, 11 Drawing Sheets

HARDMASK MANUFACTURE IN FERROELECTRIC CAPACITORS

TECHNICAL FIELD

The disclosure is directed, in general, to semiconductor devices, and more specifically, to methods for manufacturing hard masks for ferroelectric capacitor structures in semiconductor devices.

BACKGROUND

High-density memory cells, such as ferroelectric memory (FRAM) cells, can used in arrays of ferroelectric capacitors fabricated as part of a complementary metal-oxide-semiconductor (CMOS) transistor process flow. The material layers of the capacitors are often fabricated by standard lithographic and etch processes which include the use of organic bottom antireflective coating (BARC) and hardmask (HM) layers formed on the material layers. Patterned BARC and HM layers are used to define the dimensions of the capacitor in a subsequent etch process performed on the material layers.

In such cases, the time required to etch the HM layer in batchs of substrates can be variable, which in turn, can cause variations in the dimensions of the etched HM layer. Variations in the dimensions of the etched HM layer, in turn, can cause undesirable variations in the dimensions of the capacitors. The fabrications of large numbers of capacitors having dimensions that are outside the range of a target dimension results in lower-than-desired yields of FRAM cells.

SUMMARY

One embodiment of the disclosure provides a method of manufacturing a semiconductor device. The method comprises fabricating a ferroelectric capacitor. Fabricating the capacitor includes forming conductive and ferroelectric material layers on a semiconductor substrate. Fabricating the capacitor also includes forming a hardmask layer on the conductive and ferroelectric layers, forming an organic bottom antireflective coating layer on the hardmask layer, and, patterning the organic bottom antireflective coating layer. Seasoning in a hardmask etching chamber is substantially unaffected by the patterning.

Another embodiment provides a method of manufacturing a ferroelectric memory cell. The method comprises forming one or more transistors on a semiconductor substrate and depositing a pre-metal dielectric layer over the transistors. The method also comprises fabricating a ferroelectric capacitor on the semiconductor substrate. The ferroelectric capacitor is electrically coupled to at least one of the transistors. Fabricating the ferroelectric capacitor includes the above-described steps.

Still another embodiment provides an integrated circuit. The integrated circuit comprises one or more ferroelectric memory cell. At least one of the memory cells includes one or more transistors on or in a semiconductor substrate, a pre-metal dielectric layer over the transistor and a ferroelectric capacitor on the pre-metal dielectric layer, the ferroelectric capacitor is electrically coupled to at least one of the transistors and its fabrication includes the above-described steps.

DETAILED DESCRIPTION

As part of the present disclosure it was recognized that chemicals typically used to etch the organic BARC layer can also de-season surfaces in a chamber in which the HM layer is etched. De-seasoning the chamber's surfaces can deleteriously decrease the concentrations of etchant chemicals used to pattern the HM layer. In such instances, to ensure that the HM layer is fully etched from one batch of substrates to the next, the duration of HM etching is extended. Unfortunately, as additional substrates are processed the chamber's de-seasoning is further reduced and progressively extended etching times can cause excessive erosion of the HM. Excessive HM erosion can cause the dimensions of the patterned HM to be smaller than a target dimension. If the patterned HM's dimensions are smaller than expected, then, the subsequent patterning of the capacitor's material layers, using these patterned HM to transfer the patterned, results in smaller than-desired capacitor dimensions. Smaller than-desired capacitors result in smaller signal levels, thus lower device yields and reliability.

As part of the present disclosure, it was recognized that reducing or eliminating the chamber's de-seasoning, or, re-establishing the chamber's seasoning, can reduce or eliminate the need for extended HM etching times. This can be accomplished when the seasoning of the HM etching chamber is not substantially affected by the chemicals used to etch the BARC layer, or, when the HM etching chamber undergoes re-seasoning after a de-seasoning BARC layer etch. This results is more consistent dimensions for the patterned HM, and hence, higher yields of capacitors of the desired target dimensions.

The terming seasoning as used herein refers to the presence of a film formed on at least some surfaces of a HM etching chamber by virtue of the HM etching process conducted in the chamber. The seasoning film includes elements from the HM material that was etched in the chamber. For example, when the material etched in the chamber is a HM layer composed of a titanium aluminum nitride (TiAlN) alloy, then the seasoning film can include one or more of the elements Ti, Al or N. In some cases, the seasoning film can also include elements from chemicals that are used for etching the HM material. For example, when the HM layer is etched using a chlorine-containing ($Cl_2$) plasma, then the seasoning film may also include the element Cl.

For the proposes of the present disclosure, a chamber's seasoning not being substantially affected means that the delay time before the onset of essentially maximum HM etching in that chamber is less than about 5 seconds. One skilled in the art would be familiar with various techniques to measure HM etching. For example, optical emission spectroscopy (OES) can be used monitor the amounts of HM elements (e.g., a Ti OES signal at 411 nanometers) released into the chamber by the HM etching process. For the purposes of the present disclosure, essentially maximum HM etching occurs when the relative concentration of HM elements released into the chamber is within about 95 percent of it maximum value during the HM etch process. The onset of essentially maximum HM etching is reflected by a plateau of constant OES signal intensity.

The term de-seasoning used herein refers to a substantial change in the seasoning film in the HM etching chamber by virtue of the BARC layer etching process conducted in the HM etching chamber. That is, de-seasoning is considered to occur when the delay time before the onset of essentially maximum HM etching in that chamber is about 5 seconds or greater. For instance, in some cases, for a de-seasoned etch chamber the delay time is 20 to 25 seconds. A continuing increase in etch rate during this period is reflected by a rising OES signal intensity, instead of a plateau as observed in a seasoned HM etch chamber. In some cases the substantial change in seasoning includes substantial changes (e.g., 10 percent or more) to one or both of the seasoning film's thickness or atomic composition.

Figure 1A:
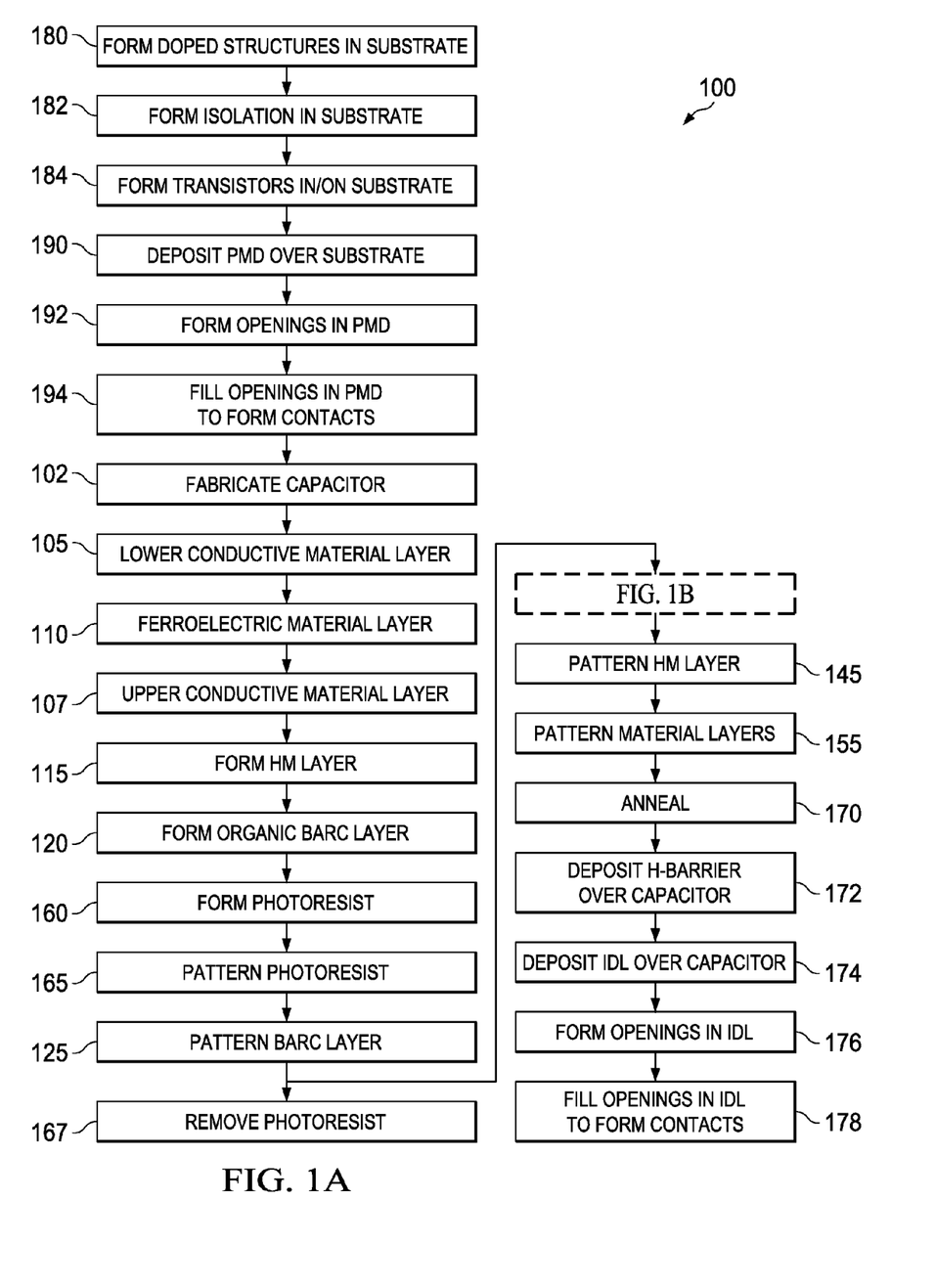
FIGS. 1A-1B present a flow diagram illustrating selected steps in an example method for fabricating semiconductor devices in which one or more aspects of the disclosure can be applied.
Figure 1B:
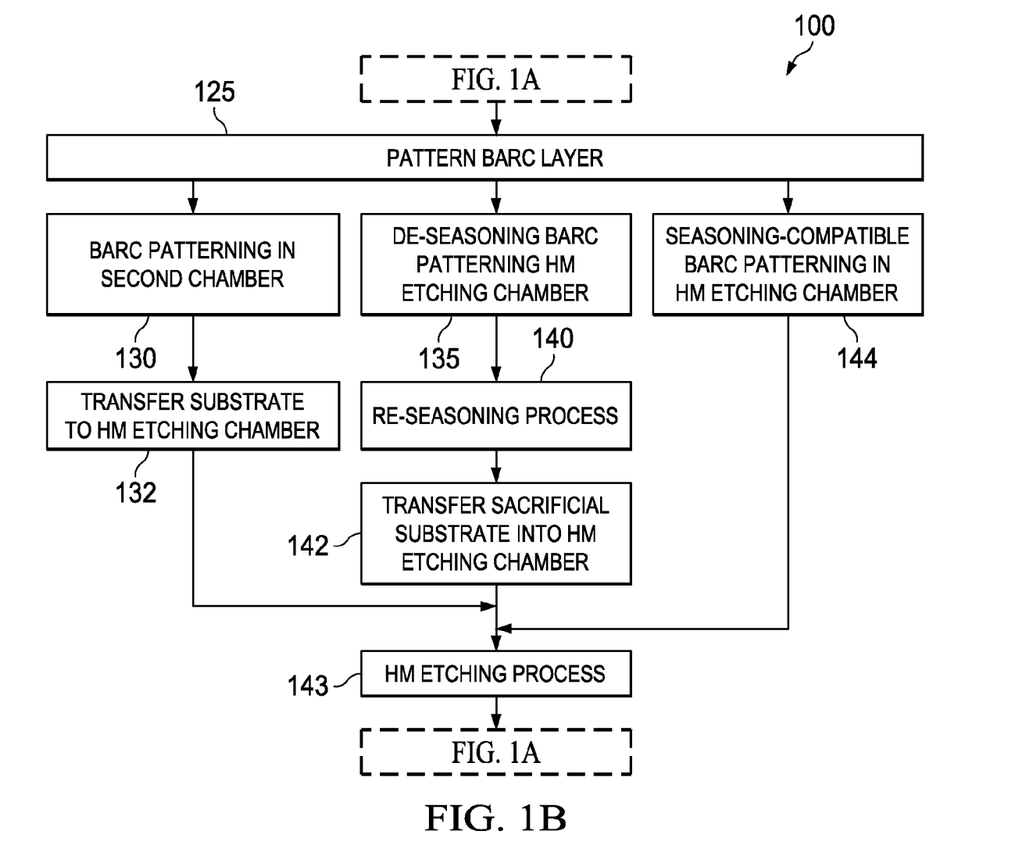

One embodiment of the disclosure is a method of manufacturing a semiconductor device. FIGS. 1A-1B present flow diagrams illustrating selected steps in an example method 100 for fabricating semiconductor devices in which one or more aspects of the disclosure can be applied. The method includes fabricating a capacitor (e.g., a ferroelectric capacitor) (step 102). As part of fabricating the capacitor, the method 100 comprises forming conductive (step 105, 107) and ferroelectric material layers (step 110) on a semiconductor substrate. As depicted in FIG. 1A, the layers can be formed in the sequence: form first conductive material layer (105), form ferroelectric material layers (step 110), and then form first conductive material layer (step 107).

Fabricating the capacitor (step 102) further includes a step 115 of forming a HM layer on the conductive and ferroelectric layers, and, a step 120 of forming an organic BARC on the hardmask layer. In some cases, for instance, the HM layer can be formed directly on the uppermost of the two conductive layers.

Fabricating the capacitor (step 102) also includes a step 125 of patterning the organic BARC layer. As disclosed herein, the seasoning of a HM etching chamber is substantially unaffected by the patterning step 125. The seasoning includes the same elements that are in the HM layer.

Some etching processes used to accomplish organic BARC layer patterning in step 125 can substantially de-season the HM etch chamber. In some cases, for instance, patterning (step 125) includes exposing the organic BARC layer to a plasma etch process (e.g., reactive ion etching, RIE) in an atmosphere that comprises at least one of $Cl_2$, $O_2$, $CF_4$, $N_2$, or $H_2$. Some embodiments of the atmosphere comprise mixtures of $Cl_2$ and $O_2$, $CF_4$ and $O_2$, or, $N_2$, and $H_2$. In some preferred embodiments, the atmosphere comprises sccm ratios of $Cl_2$: $O_2$ equal to about 40:20. Such etching protocols can substantially de-season the HM etching chamber such that the onset of essentially full HM etching in the de-seasoned chamber is delayed by 5 seconds or more, as compared to an identical HM etching process performed in a seasoned HM etching chamber. E.g., in some cases the full HM etching in the de-seasoned chamber is delayed by about 20 to 25 seconds of an about 60-second plasma etch processes.

The present disclosure recognized several ways to pattern the organic BARC according to step 125 so as to not affect the chamber's seasoning at the stage when the HM is patterned.

As shown in FIG. 1B, in certain embodiments, the organic BARC patterning of step 125 can be performed in a second chamber (step 130). Because organic BARC patterning is not performed in the same HM etching chamber that has the seasoning, the HM etching chamber's seasoning is not affected by the patterning step 125. Therefore de-seasoning of the HM etching chamber can be avoided. The capacitor's fabrication process (step 102) using a second chamber, however, requires the presence of two different chambers, e.g., two chambers in the same or two different single-chambered etching tools. The first chamber is dedicated to HM etching and the second chamber is dedicated organic BARC layer etching. Additionally, the process 102 requires an additional step of transferring (step 132) the semiconductor substrate from the second chamber to the HM etching chamber.

As also shown in FIG. 1B, in other embodiments, the organic BARC patterning step 125 can be performed in the HM etching chamber that has seasoning (step 135). The patterning step 125 can include patterning conditions that de-seasons the HM etching chamber. E.g., the patterning in the chamber in step 135 can include a de-seasoning plasma etch process in an atmosphere that comprises $Cl_2$ and $O_2$. However, the HM etching chamber is then subjected to a re-seasoning process (step 140), the re-seasoning process is performed in the chamber after the patterning step 125, but before a hardmask etching process (step 145) is performed in the chamber. The re-seasoning process (step 140) re-establishes the seasoning of the chamber and therefore the seasoning of the chamber is unaffected by the BARC layer patterning step 125. The re-seasoning process (step 140) can be any process that returns the seasoning film to the chamber's surfaces. For example, in some cases, the re-seasoning process includes transferring (step 142) one or more HM-covered seasoning substrates (e.g., a sacrificial substrates) in the HM etching chamber and exposing (step 143) the HM-covered seasoning substrates to a HM etching process.

Performing organic BARC patterning (step 125) in the HM etching chamber (step 135) has the advantage of not requiring an etching tool with multiple chambers, or, requiring multiple etching tools. However, additional time, and material costs for the sacrificial material wafers, are required to perform the re-seasoning process (step 140). Moreover, the semiconductor substrates having received the organic BARC patterning (step 135) must then be removed from the HM etch chamber and stored elsewhere during the re-seasoning process (step 140), and, then transferred back to the HM etching chamber after the re-seasoning process (step 140) is completed.

As further shown in FIG. 1B, in still other embodiments, the organic BARC patterning step 125 is once again performed in the HM etching chamber that has seasoning. The atmosphere used in the patterning step 125, however, consists essentially of using seasoning-compatible etchant gases (step 144) in the HM etching chamber. The seasoning-compatible etchant gases do not substantially affect the chamber's seasoning. Performing the BARC etch in the HM etching chamber with seasoning-compatible etchant gases has the advantage of not requiring additional chambers or etching tools, avoids having to transfer the substrate between different chambers, and eliminates the need to perform chamber re-seasoning and to store the substrate elsewhere during re-seasoning.

In some cases, the seasoning-compatible etchant gases includes $CHF_3$. In some preferred embodiments, the atmosphere of seasoning-compatible etchant gases used in the HM etching chamber (step 150) consists essentially of $CF_4$, $CHF_3$ and $O_2$. For example, the atmosphere of seasoning-compatible etchant gases (e.g., in an Applied Materials decoupled plasma source etching tool) can include sccm ratios $CF_4$: $CHF_3$:$O_2$ equal to about 40:40:14. In some preferred embodiments, more uniform patterned organic BARC dimensions are obtained when the patterning step 125 includes certain chamber conditions. This can include maintaining the chamber's pressure in a range of 4 to 15 mTorr, and more preferably about 8 mTorr, and, applying a substrate bias power a range of about 50 to 150 Watts, and more preferably of about 100 Watts. This can also include maintaining a radio frequency source power in a range of about 1000 to 2000 Watts, and more preferably 1500 W during the patterning step 125.

One skilled in the art would understand that the pressures, powers and gas flow rates will depend significantly on the particular manufacturer and hardware system type of the etch system that is used. One skilled in the art would be able to use the values given herein, derived using an inductively coupled plasma etch tool, as a guide to adjust the values as appropriate for different types of plasma etch tools, such as capacitively-coupled or ECR plasma etch tools.

In some cases, the chamber's atmosphere of seasoning-compatible etchant gases (step 144) can include Ar or other inert gases. In some preferred embodiments, for example, the atmosphere of seasoning-compatible etchant gases (step 140) consists essentially of $CF_4$, $CHF_3$, $O_2$ and Ar.

As shown in FIG. 1A, fabricating the ferroelectric capacitor (step 102) can further include patterning the HM in the seasoned HM etching chamber (step 145). In some preferred embodiments, patterning the HM (step 145) includes a plasma etching process (e.g., RIE) conducted in a chlorine-containing atmosphere. In some preferred embodiments the chlorine-containing atmosphere can include $Cl_2$, $BCl_3$ or mixtures thereof. For example, the chlorine-containing atmosphere can include sccm flow ratios of $Cl_2$:$BCl_3$ of about 80:50. In some cases, the sccm flow ratios of $Cl_2$:$BCl_3$ can be changed from about 80:50 to about 50:50 during an over-etch phase of the HM patterning step 145. In some preferred embodiments, the uniformity of the dimensions of the patterned HM are improved when HM patterning (step 145) includes maintaining the chamber's pressure at about 5 mTorr, applying a radio frequency source power of about 1400 Watts, and, applying substrate bias of about 100 Watts.

Fabricating the ferroelectric capacitor (step 102) can further include a step 155 of patterning the conductive and ferroelectric material layers to respectively form patterned electrodes and a ferroelectric layers of the ferroelectric capacitor. One skilled in the art would be familiar with conventional processes to pattern the conductive and ferroelectric material layers. In some embodiments, for example, patterning the conductive and ferroelectric material layers (step 160) includes a plasma etch process in a chlorine-containing atmosphere (e.g., $Cl_2$), and, can contain other gases (e.g., $O_2$, $N_2$, or CO).

Fabricating the ferroelectric capacitor (step 102) can further include a step 160 of forming a photoresist layer on the organic BARC layer, and step 165 of patterning the photoresist layer. Conventional photolithographic processes can then be used to pattern the photoresist in step 165, such that the patterned photoresist has dimensions to match target dimensions (e.g., length and width) of the ferroelectric capacitor. The dimensions of the patterned photoresist are subsequently transferred to the patterned organic BARC layer (step 125), HM layer (step 145) and conductive and ferroelectric material layers (step 155).

In some cases, the patterned photoresist can be removed in step 167 after patterning the organic BARC layer (step 125) but before patterning the HM layer (step 145). In some cases, removing the patterned photoresist at this stage can beneficially avoid the presence of photoresist materials that could contaminate the HM etching chamber. In some cases, removing the patterned photoresist can include one or both of a conventional ash process (e.g., about 100° C. higher) or conventional wet clean process (e.g. exposure to a mixture of $H_2O$, $H_2O_2$ and $NH_4OH$). In other cases, however, the patterned photoresist gets removed as part of patterning the organic BARC layer (step 125) or the HM layer (step 145).

There can be several additional steps to complete the manufacture of the semiconductor device. Example manufacturing steps include: annealing the patterned capacitor (step 170), forming a conformal hydrogen barrier layer over the capacitor (step 172), depositing an inter-level dielectric layer (ILD) over the capacitor (step 174), forming openings in the inter-level dielectric layer (step 176), and filling the openings with a conductive material (step 178) to thereby form contacts. The contacts can be configured to electrically couple the ferroelectric capacitor to other components of the semiconductor device.

The manufacture of the semiconductor device can also include several device manufacturing steps prior to fabricating the ferroelectric capacitor in step 102. Non-limiting examples include implanting dopants to form doped structures (e.g., doped wells) in the semiconductor substrate (step 180), forming isolation structures (step 182), such as shallow trench isolation or field oxide structures, in the substrates, and forming transistors (step 184) in or on the substrate. Additional manufacturing steps can include depositing a pre-metal dielectric (PMD) layer over the transistors (step 190), forming openings in the PMD layer (step 192) and filling the openings with a conductive material (step 194) to form contacts configured to electrically couple the transistor to each other or to capacitors of the device.

With continuing reference to FIG. 1, FIGS. 2-10 illustrate selected steps in an example method of manufacturing a semiconductor device in accordance with FIG. 1. The method steps of FIGS. 2-8 are presented in the context of manufacturing an integrated circuit semiconductor device (IC) 200 configured as a ferroelectric memory cell. However, one skilled in the art would understand how the method could be applied to the manufacture of any semiconductor device containing the ferroelectric capacitor as described herein.

Figure 2:
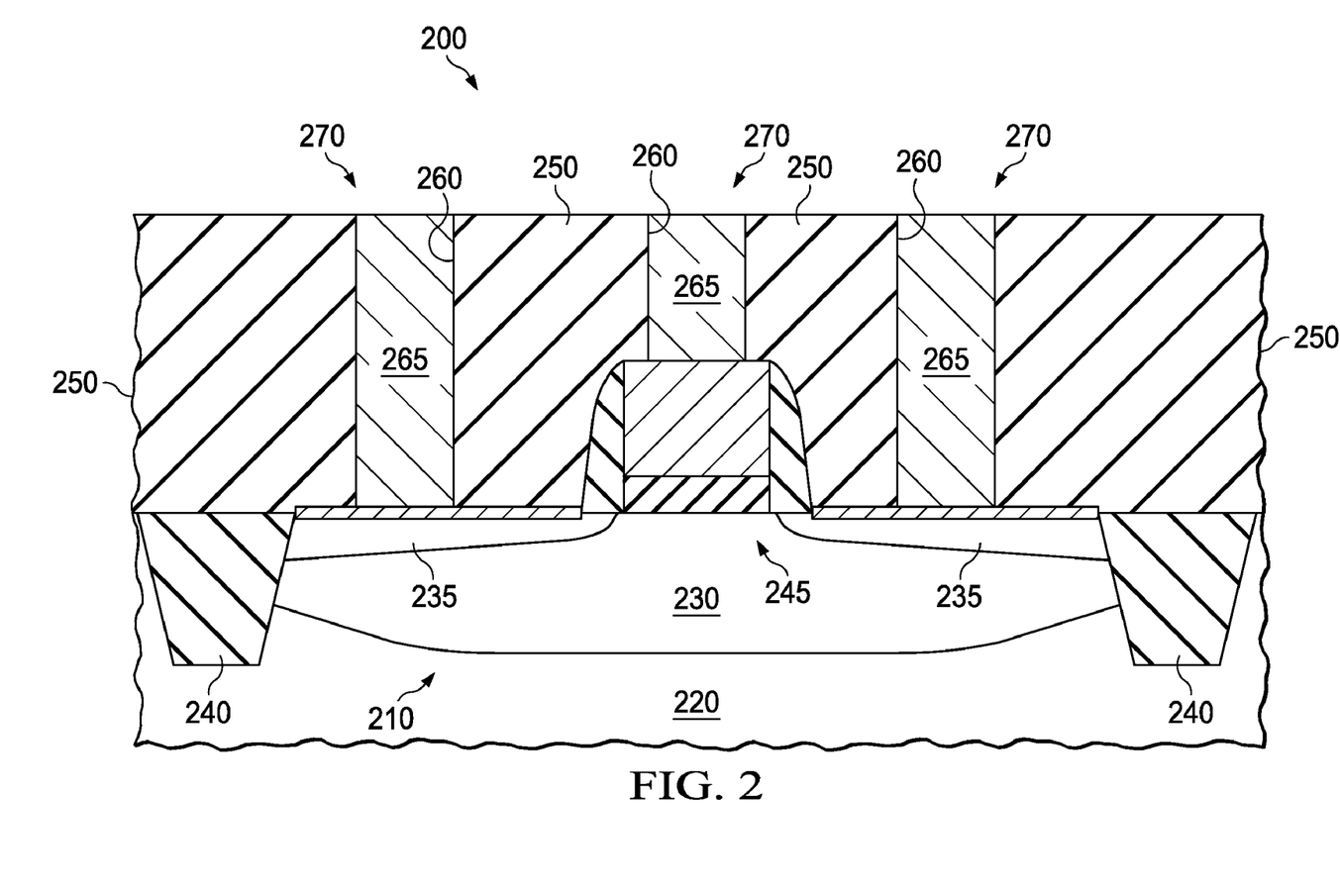
FIGS. 2-10 present cross-section views of selected steps in example implementation of a method of fabricating a semiconductor device comprising an integrated circuit according to the principles of the present disclosure.

FIG. 2 shows the IC 200 after forming one or more transistors 210 (e.g., nMOS, pMOS, CMOS transistors) on a semiconductor substrate 220 in accordance with step 184. Any conventional materials and methods can be used to form the transistors 210, such as discussed in U.S. Pat. No. 7,250,349 by Celii et al. ("Celii"), U.S. Pat. No. 7,220,600 by Summerfelt et al. ("Summerfelt"), in U.S. Pat. No. 6,500,678 to Aggarwal et al. ("Aggarwal"), or U.S. patent application Ser. No. 12/025,207 by Celii et al. ("Celii-2"), which are incorporated herein by reference in their entirety. E.g., FIG. 2 shows the IC 200 after forming a doped well 230, doped source and drain structures 235, shallow trench isolation structures 240, and transistor gate structure 245 in or on the substrate 220, in accordance with steps 180-184 and other steps well known to those skilled in the art. Further examples of such steps are presented in Celii, Summerfelt or Aggarwal.

FIG. 2 also shows the IC 200 after depositing a pre-metal dielectric layer 250 over the substrate 220 and over the transistors 210 in accordance with step 190. FIG. 2 further shows the IC 200 after forming openings 260 in the pre-metal dielectric layer 250 and filling the openings 260 with a conductive material 265 to form a contact 270, in accordance with steps 192 and 194, respectively. As illustrated in FIG. 2, the contacts 270 touch the transistor 210 (e.g., source and drain regions 235 and gate structures 245 of individual transistors 210). Any suitable dielectric material and conductive material may be used for the pre-metal dielectric layer 250 (e.g., silicon dioxide), and contacts 270 (e.g., tungsten), respectively. Additional examples of suitable materials are presented in Celii, Summerfelt or Aggarwal.

Figure 3:
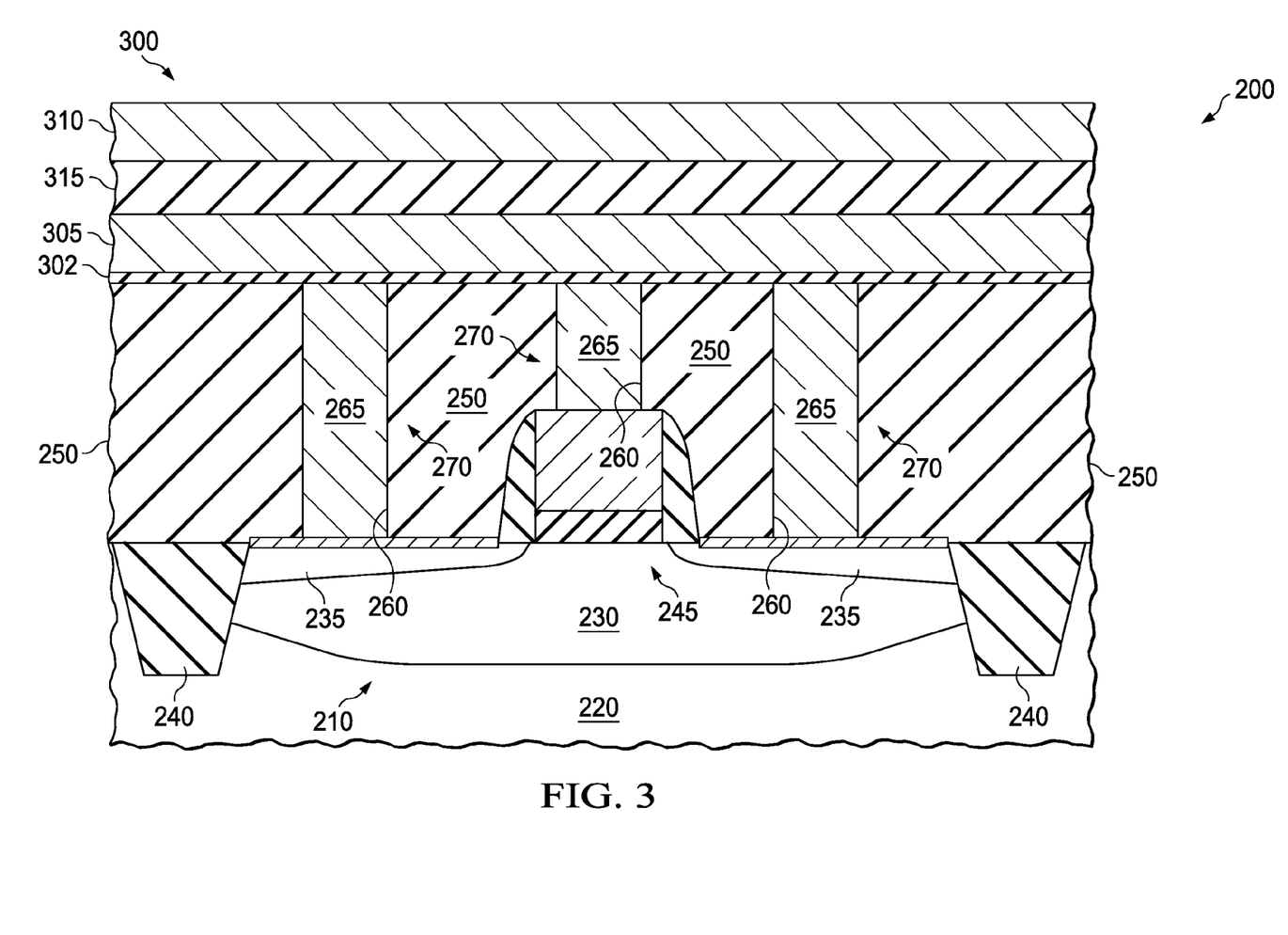

FIGS. 3-8 show example steps in the fabrication of a ferroelectric capacitor 300 on the semiconductor substrate 220 in accordance with step 102. FIG. 3 shows the IC 200 after forming lower and upper conductive material layers 305, 310 and a ferroelectric material layer 315 on the substrate 220 in accordance with steps 105, 107 and step 110, respectively. In some cases, the conductive material layers 305, 310 and ferroelectric material layer 315 are formed on the pre-metal dielectric layer 250, and more specifically, on a diffusion barrier layer 302 (e.g., a TiAlN layer) formed on the pre-metal dielectric layer 250. The diffusion barrier layer 302 and the pre-metal dielectric layer 250 can be formed via chemical vapor deposition (CVD), physical vapor deposition (PVD), or other processes well known to those skilled in the art.

The conductive layers 305, 310 of the capacitor 300 can be metal-containing layers comprise one or more noble metal. E.g., the conductive material layers 305, 310 can comprise one or more pure, or oxides of, noble metals. Examples include Ir, $IrO_x$, Pt, Pd, $PdO_x$, Au, Ru, $RuO_x$, Rh, $RhO_x$, $LaSrCoO_3$, $(Ba,Sr)RuO_3$, $LaNiO_3$, $YBa_2Cu_3O_{7-x}$, $AgO_x$, or multilayered combinations thereof ($x \geq 1$). The term ferroelectric material layer 315, as used herein, refers to any material layer having a permanent electric dipole moment and whose polarization can be changed by application of an electric field. Examples include lead zirconate titanate (PZT), strontium bismuth tantalate (SBT), or other suitable materials well know to those skilled in the art.

Forming the lower conductive material layer 305 can include depositing (e.g., via CVD or PVD) a lower noble metal-containing material layer 305 (e.g., Ir) on the substrate 220 (e.g., directly on the diffusion barrier layer 302). Forming the ferroelectric layer 315 on the lower conductive layers 305 can include depositing, via metal organic CVD, a ferroelectric material such as PZT. The upper noble metal-containing conductive material layer 310 can comprise similar materials as used for the lower noble metal-containing material layer 305. Examples of additional suitable materials and deposition methods for forming conductive and ferroelectric material layers are presented in Celii, Summerfelt or Aggarwal.

Figure 4:
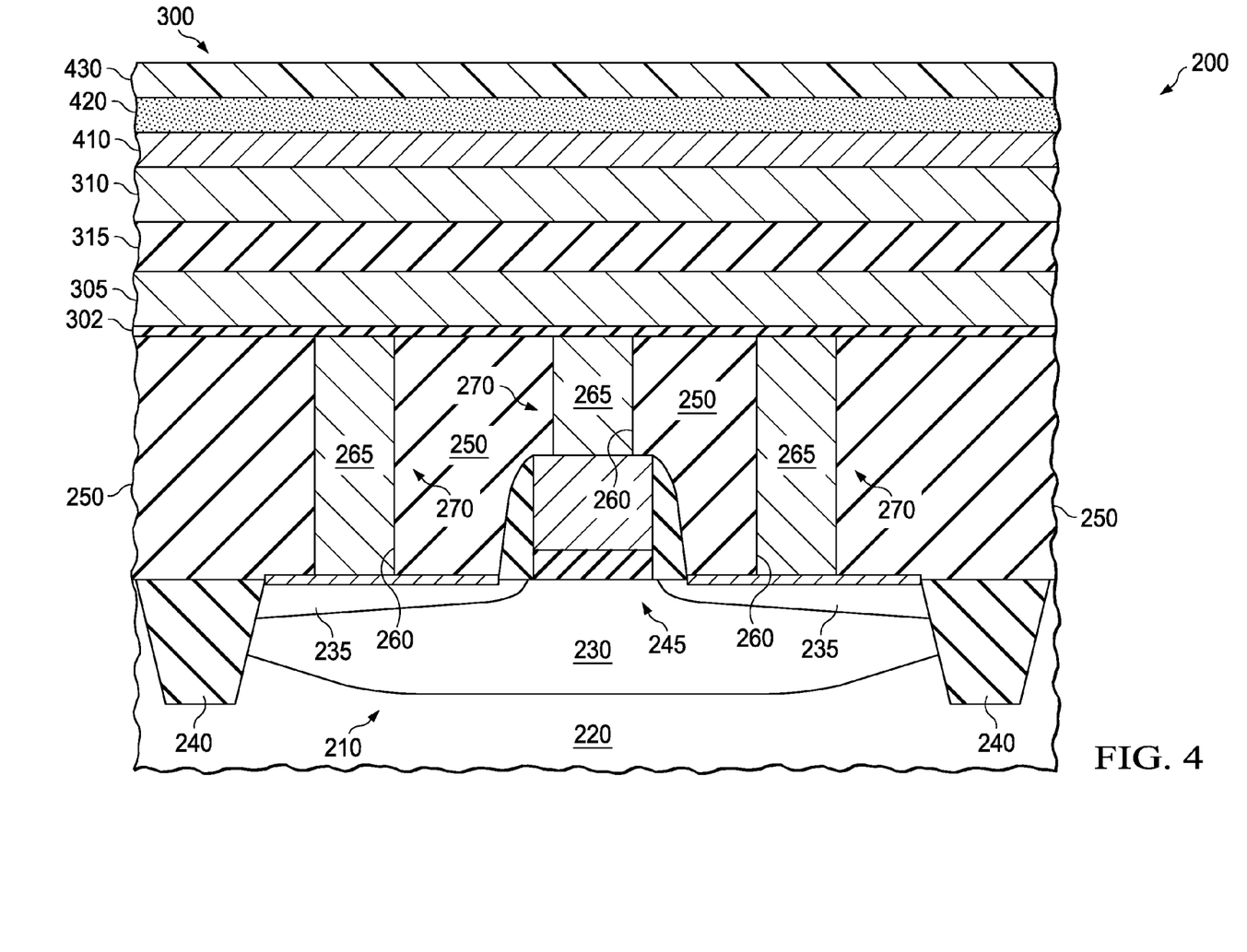

FIG. 4 shows the IC 200 after forming a HM 410 on the conductive and ferroelectric layers 305, 310, 315 in accordance with step 115. In some embodiments, the HM layer 410 comprises one or more layers of TiAlN, titanium aluminum oxynitride ($TiAlO_xN$), or titanium nitride (TiN). One skilled in the art would be familiar with other metal alloy compositions that could serve as a HM. Conventional deposition processes, such as CVD or PVD, can be used to form the HM layer (step 115).

FIG. 4 also shows the IC 200 after forming an organic BARC layer 420 on the HM layer 410 in accordance with step 120. The organic BARC can comprise any conventional organic material known to reduce undesirable reflections that can occur during photolithography. The organic BARC layer 420 can be formed (step 120) using a spin-on deposition process, or, other conventional deposition processes well-known to those skilled in the art.

FIG. 4 further shows the IC 200 after forming a photoresist layer 430 on the HM layer 410 (step 160). The photoresist layer can be composed of any conventional light-sensitive material commonly used in the semiconductor industry. A spin-on deposition process or other conventional processes well-known to those skilled in the art techniques can be used to deposit the photoresist layer in step 160.

Figure 5:
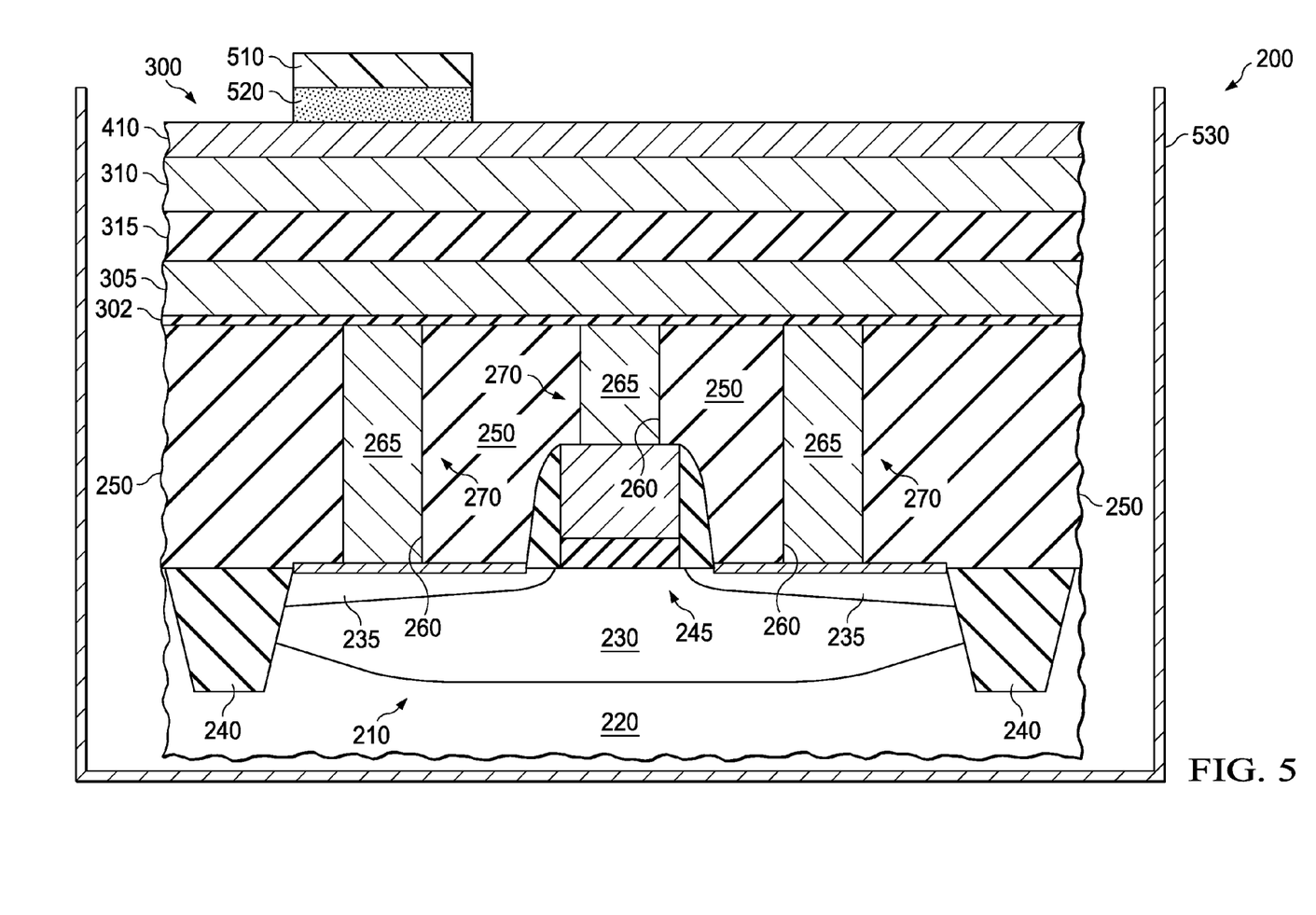

FIG. 5 shows the IC 200 after patterning (step 165) the photoresist layer 420 (FIG. 4) using conventional photolithographic methods to form a patterned photoresist layer 510. FIG. 5 also shows the IC 200 after patterning (step 125) the organic BARC layer 420 (FIG. 4) to form a patterned organic BARC layer 520. In some embodiments, such as shown in FIG. 5, the organic BARC layer 420 (FIG. 4) is patterned (step 125) in a chamber 530 (step 130) that is not a HM etching chamber. Consequently, the seasoning in the hardmask etching chamber is not affected by the BARC patterning step 125.

Figure 6:
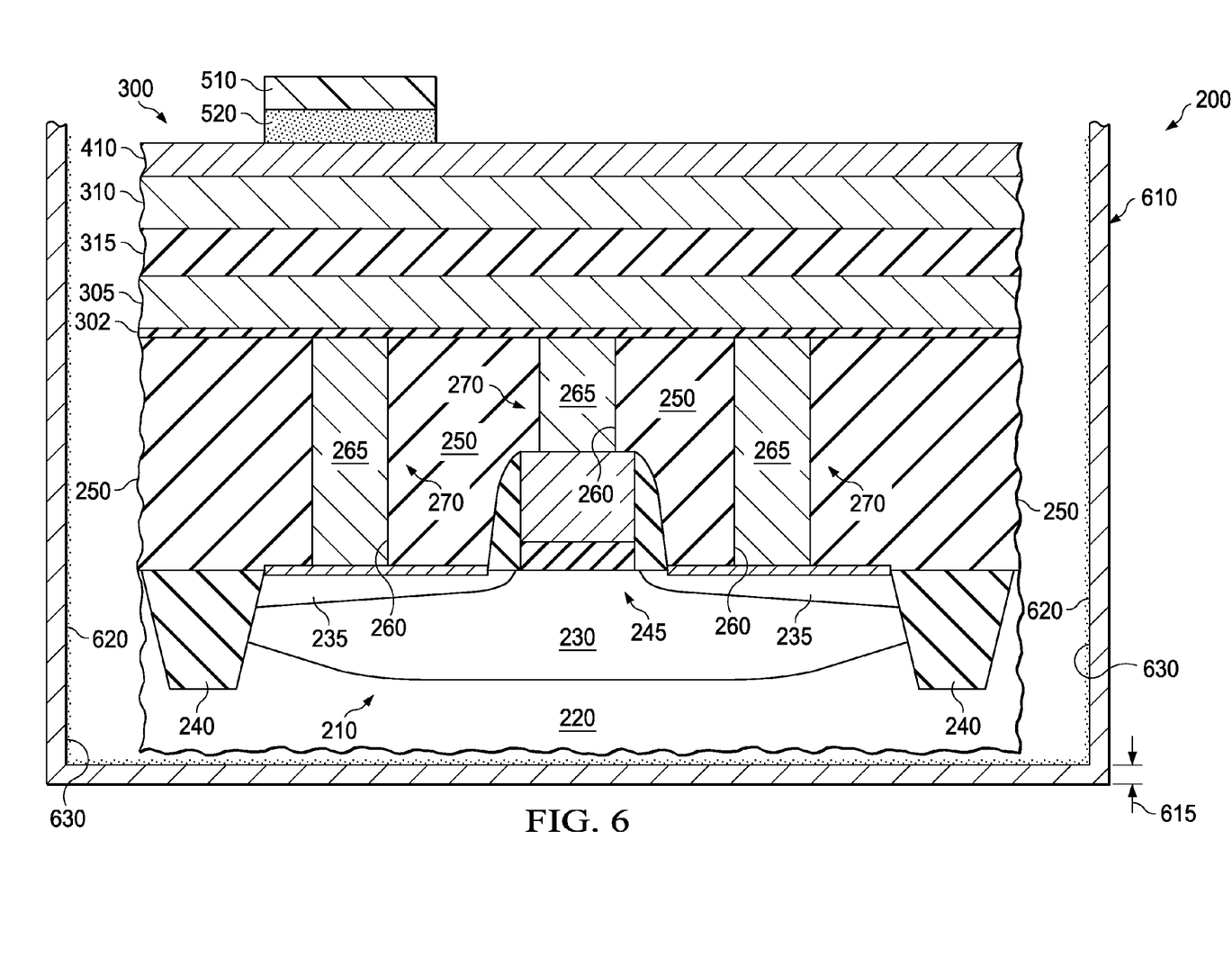

In other embodiments, such as shown in FIG. 6, the organic BARC layer 420 (FIG. 4) is patterned (step 125) in a HM etching chamber 610 (step 135) to form the patterned BARC layer 520. The patterning step 135 includes performing a plasma etch in a HM etching chamber 610 using an atmosphere of seasoning-compatible etchant gases. In some cases the seasoning-compatible etchant gases consist essentially of $CF_4$, $CHF_3$ and $O_2$. In such cases, the seasoning of the chamber 610 is substantially unaffected by the patterning. E.g., the seasoning film's thickness 615 or, the film's chemical composition, are not substantially changed by the BARC layer patterning (step 125). That is, a seasoning film 620 on surfaces 630 of the chamber 610 is not sufficiently affected so as to cause a delay (e.g., the delay is less than about 5 seconds) in the onset of essentially maximum HM etching during a subsequent HM patterning step 145. In some cases, for instance, the thickness 615 or the atomic composition of the film 620 is changed by less than 10 percent by the BARC patterning step 125.

Figure 7:
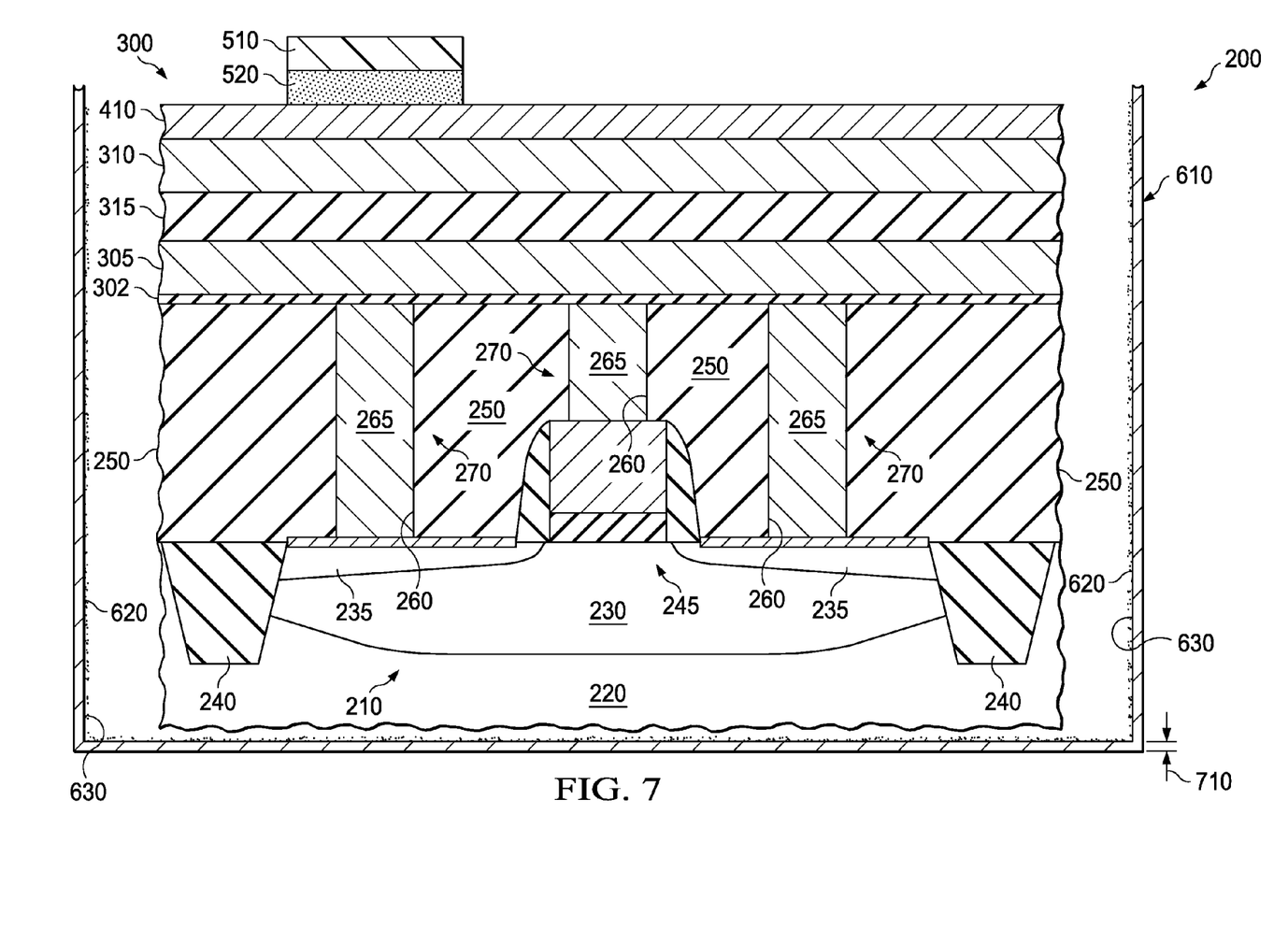

In still other embodiments, such as shown in FIG. 7, the organic BARC layer 420 (FIG. 4) is also patterned (step 125) in the HM etching chamber 610 (step 135). The patterning step 135, however, includes performing a plasma etch in the HM etching chamber 610 using an atmosphere (e.g., an atmosphere of $O_2$ and $Cl_2$) that does alter the seasoning. That is, the seasoning film 620 on surfaces 630 of the chamber 610 is sufficiently affected as to cause a delay (e.g., the delay is about 5 seconds or greater) in the onset of essentially maximum HM etching during a subsequent HM patterning step 145. For instance, one of both of the thickness 710 or the chemical composition of the seasoning film 620 can be affected sufficiently to cause the delay. For example the seasoning film 620 can be affected such that etching species derived from $BCl_3$ are depleted during the subsequent HM patterning step 145. The depletion of the species derived from $BCl_3$ can cause the delay.

Figure 8:
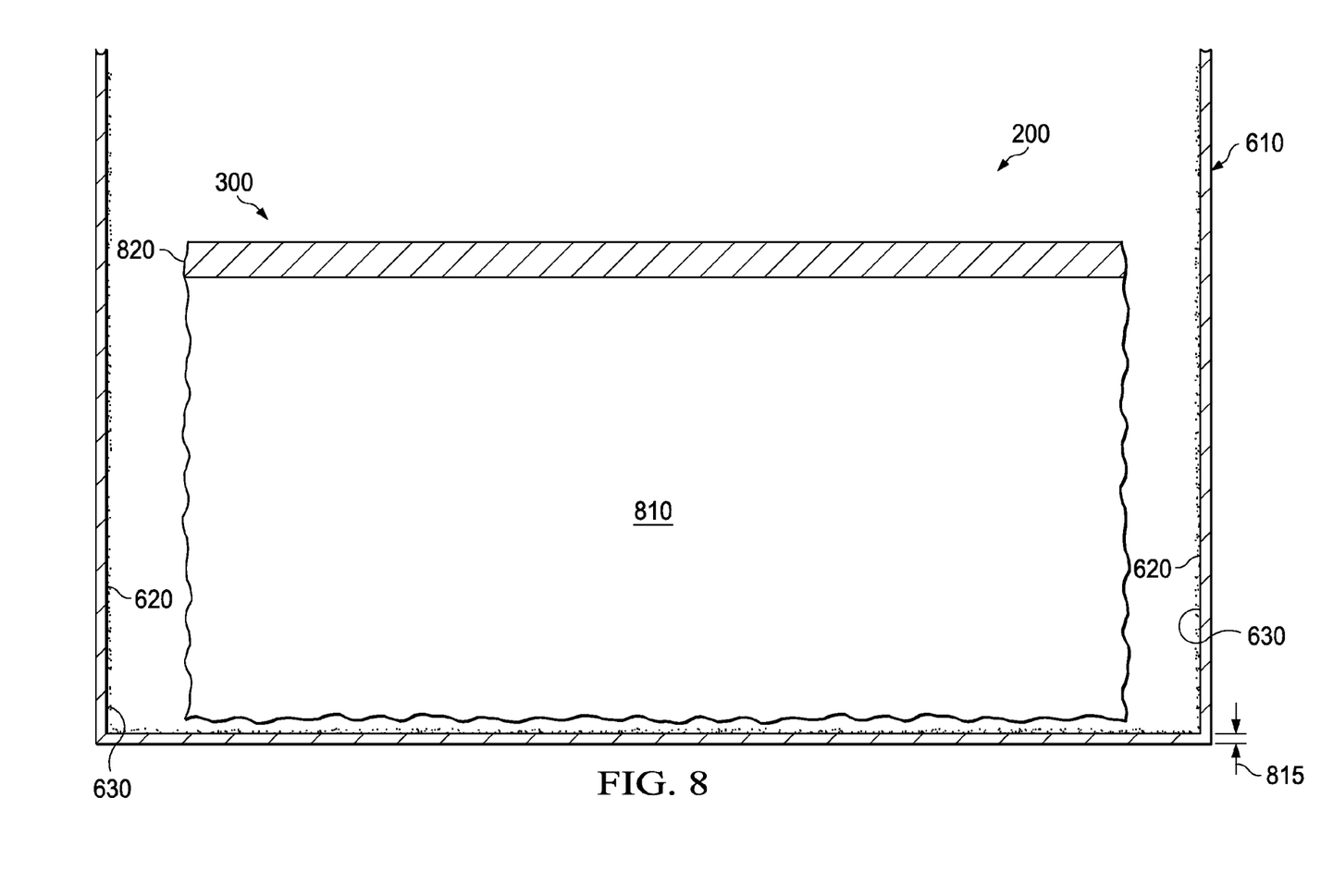

In such embodiments, such as shown in FIG. 8, the patterning step 125 further includes performing a re-seasoning process (step 140) in the hardmask etching chamber 610 such that the seasoning is restored. For example, after removing the substrate 210 from the chamber 610, one or more sacrificial substrates 810 that are covered with an HM layer 820 can be transferred into the HM etching chamber 610 (step 146) and then exposed to an HM etching process (step 148). E.g., the seasoning film's 620 thickness 815 or chemical composition is restored to substantially the same thickness or composition that was present is the chamber 610 before the BARC patterning step 125.

In some cases, it is advantageous for the HM layer 820 to have the same composition as the HM layer 410, and, for the HM etching process (step 148) to be substantially the same as the etching process used for HM patterning (step 145). Using the same etching process and same composition of HM material can help ensure that the chamber 610 is restored and hence unaffected by the patterning step 125. In other cases, however, different HM layer 820 compositions or etching processes (step 148) could be used as part of restoring the chamber's seasoning.

Figure 9:
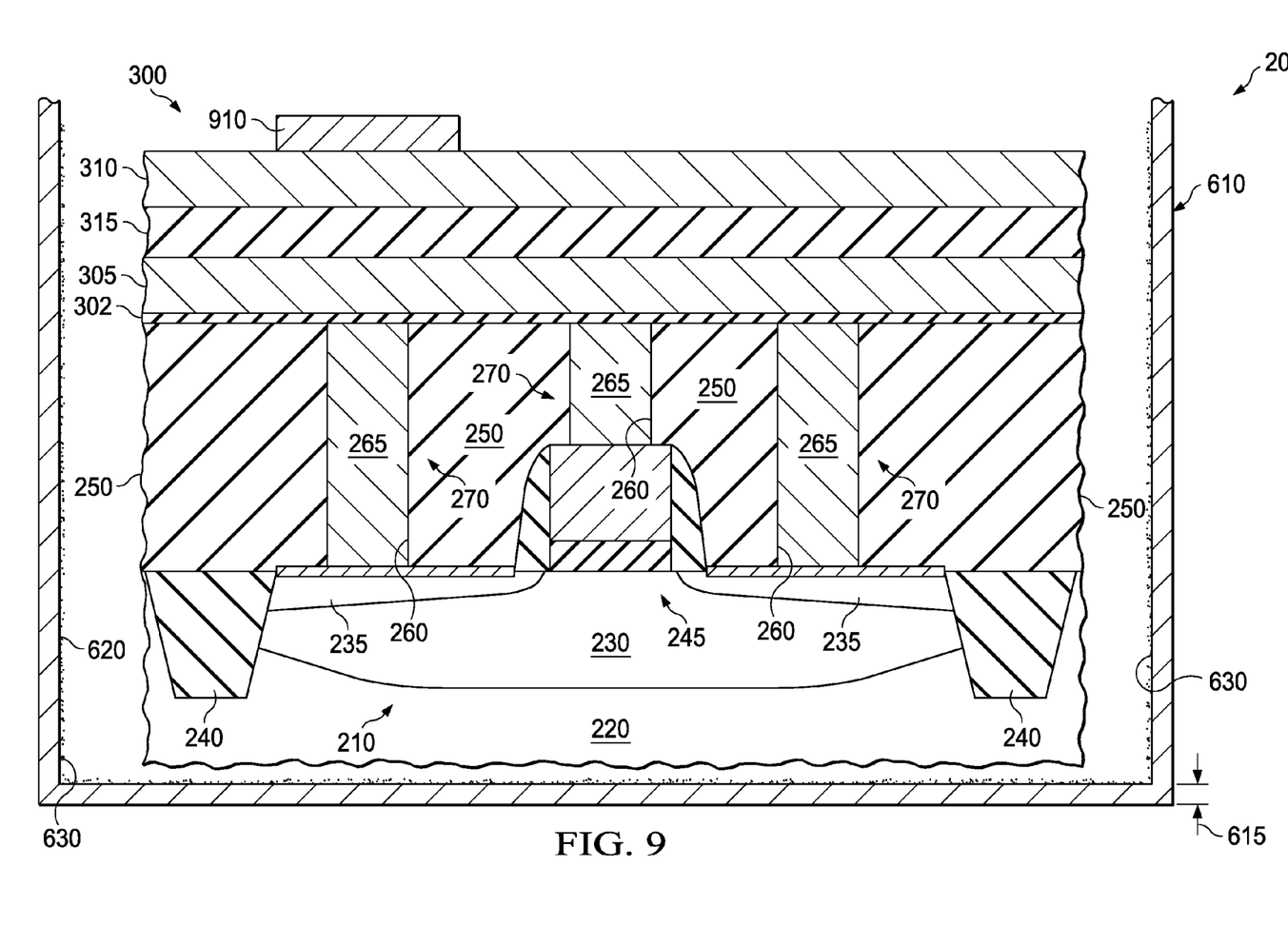

FIG. 9 shows the IC 200 after patterning (step 145) the hardmask layer 410 in the hardmask etching chamber 610 to form a patterned HM 910. For instance, after the organic BARC patterning step 125, the substrate 220 shown in FIG. 5, 6 or 7, can be transferred to the chamber 610 (step 132), or, retained in the chamber, and then patterned according to step 145. FIG. 9 also depicts the IC 200 after removing the patterned photoresist 510 and patterned BARC layer 520 (e.g., FIG. 5, 6, 7).

Figure 10:
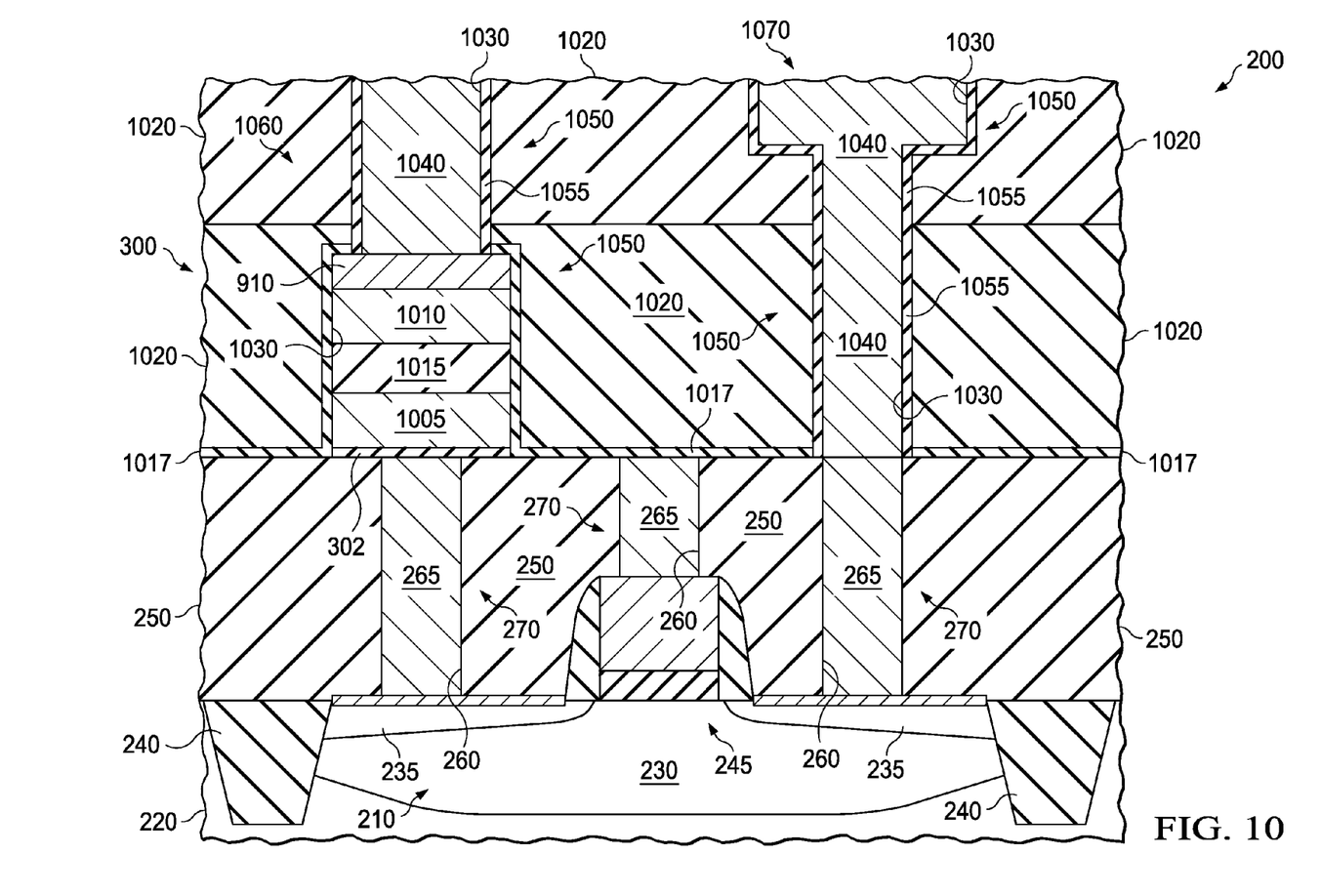

FIG. 10 shows the IC 200 after patterning the conductive and ferroelectric material layers 305, 310, 315 (FIG. 9) in accordance with step 115, to form patterned lower and upper electrodes 1005, 1010 and a patterned ferroelectric layer 1015 of the ferroelectric capacitor 300. The conductive and ferroelectric material layers 305, 310, 315 can be etched (e.g., using a RIE processes) in separate etch processes, or they can be etched using a single etch process. In some cases, the patterned HM 910 can be used as the etch mask for all of the layers 305, 310, 315. In other case, separate HMs, formed and patterned such as disclosed herein, can be used as etch masks for the patterning of underlying layers 310, 315.

Example RIE processes to remove portions of the material layers 305, 310, 315 not covered by the patterned HM 910 can include dry plasma etches using feed gases of halogens (e.g., $Cl_2$), either alone, or in combination with other feed gases (e.g., $O_2$, $N_2$). Typically the different layers 305, 310, 315 of the capacitor 300 require different etch chemistries. For instance, the RIE etch process for the ferroelectric material layer can comprises $Cl_2$, $O_2$, and a fluorocarbon gas ($CHF_3$). Further examples conditions of suitable RIE etch processes are presented in Celii-2.

As shown in FIG. 2 in some cases the patterned HM 910 is retained as part of the final structure of the capacitor 300. For instance in some cases the patterned HM 910 can serve as a diffusion barrier layer. In other cases however, the patterned HM 910 is removed.

FIG. 10 further shows the IC 200 after performing an anneal in accordance with step 160 to improve the yield of capacitors 300 having low leakage currents, such as further discussed in Celii-2. FIG. 10 also shows the IC 200 after forming an optional hydrogen barrier layer 1017 (e.g., Aluminum Oxide deposited by atomic layer deposition) over the capacitor 300 in accordance with step 170. In some cases, the hydrogen barrier layer 1017 conformally covers the entire surface of the capacitor 300 as well as the metal dielectric layer 250.

FIG. 10 also shows the IC 200 after depositing one or more inter-level dielectric (ILD) layers 1020 on the substrate 220. As shown in FIG. 8, the ILD layers 1020 can be formed on the capacitor 300 and pre-metal dielectric layer 250, in accordance with step 172. Each of the ILD layers 1020 can comprise single or multi-layered combinations of insulating materials such as silicon oxide (e.g., $SiO_2$), fluorosilicate glass (FSG), phosphosilicate glass (PSG), or other low dielectric constant materials (e.g., dielectric constant of about 4 or less). The ILD layers 1020 can be deposited using CVD, PVD, ALD or other conventional methods. Additional example materials and deposition processes are presented in Celii, Summerfelt or Aggarwal.

FIG. 10 further shows the IC 200 after forming openings 1030 in the inter-level dielectric (step 175), and optional hydrogen barrier layer 1017, and filling the openings 1030 with a conductive material 1040 (step 177) to form contacts 1050. Conventional patterning and etching methods can be used to form single or dual damascene openings 1030. Suitable example conductive materials 1040 includes Al, W or Cu, and, the conductive materials 1040 can further include a metal diffusion barrier 1055 (e.g., silicon carbide or silicon nitride) lining the openings 1030. Other suitable contact material and methods of forming openings and forming contacts are presented in Celii, Summerfelt or Aggarwal.

The contacts 1050 can be configured to electrically couple the ferroelectric capacitor 300 to other components of the IC 200. E.g., the ferroelectric capacitor 300 can be electrically coupled to at least one of the transistors 210 through one or more contacts 1050. In some embodiments, one or more transistor 210 and the ferroelectric capacitor 300 are interconnected to form a memory cell 1060.

Another embodiment of the disclosure is depicted in FIG. 10, an IC 200. The IC 200 comprises one or more memory cells 1070, wherein at least one of the memory cells 1070, includes one or more transistors 210 on or in a semiconductor substrate 220 and the one or more capacitor 300. The IC 200 further comprises a pre-metal dielectric layer 250 over or on the one or more transistors 210 and ferroelectric capacitor 300. The ferroelectric capacitor 300 is electrically coupled to at least one of the transistors 210. Embodiments of the IC 200 can be fabricated by any of the methods discussed above.

Those skilled in the art to which the invention relates will appreciate that other and further additions, deletions, substitutions and modifications may be made to the described example embodiments, without departing from the invention.

What is claimed is:

1. A method of manufacturing a semiconductor device, comprising:
   fabricating a ferroelectric capacitor including:
      forming conductive and ferroelectric layers on a semiconductor substrate;
      forming a hardmask layer on said conductive and ferroelectric layers;
      forming an organic bottom antireflective coating layer on said hardmask layer; and
      patterning said organic bottom antireflective coating layer, wherein seasoning in a hardmask etching chamber is substantially unaffected by said patterning.

2. The method of claim 1, wherein said patterning is performed in a second chamber.

3. The method of claim 2, wherein said patterning in said second chamber includes exposing said organic bottom antireflective coating layer to a plasma etch in an atmosphere that comprises $Cl_2$ and $O_2$.

4. The method of claim 1, wherein said patterning is performed in said hardmask etching chamber and said patterning includes exposing said organic bottom antireflective coating layer to a plasma etch in an atmosphere that comprises at least one of $Cl_2$, $O_2$, $CF_4$, $N_2$, or $H_2$.

5. The method of claim 4, wherein a re-seasoning process is performed after said patterning but before a hardmask etching process is performed on said hardmask layer in said hardmask etching chamber.

6. The method of claim 5, wherein said re-seasoning process includes exposing at least one hardmask-covered sacrificial substrate in said hardmask etching chamber to said hardmask etching process.

7. The method of claim 1, wherein said patterning is performed in said hardmask etching chamber and said patterning includes exposing said organic bottom antireflective coating layer to a plasma etch in an atmosphere that includes $CHF_3$.

8. The method of claim 7, wherein said atmosphere includes sccm ratios of $CF_4$:$CHF_3$:$O_2$ equal to about 40:40:14.

9. The method of claim 1, wherein said patterning includes maintaining said hardmask etching chamber's pressure of about 8 mTorr, and, applying a substrate bias power of about 100 Watts.

10. The method of claim 1, wherein said patterning is performed in said hardmask etching chamber and said patterning includes exposing said organic bottom antireflective coating layer to a plasma etch in an atmosphere that consists essentially of $CF_4$, $CHF_3$ and $O_2$, or, $CF_4$, $CHF_3$ and Ar.

11. The method of claim 1, wherein fabricating said ferroelectric capacitor further includes patterning said hardmask layer in said hardmask etching chamber.

12. The method of claim 11, wherein patterning said hardmask comprises a hardmask etching process that includes a plasma etch in a chlorine-containing atmosphere.

13. The method of claim 12, wherein said hardmask etching process includes maintaining said chamber's pressure at about 5 mTorr, applying a radio frequency source power of about 1400 Watts, and, applying substrate bias of about 100 Watts.

14. The method of claim 1, wherein said hardmask includes titanium aluminum nitride, titanium aluminum oxynitride or titanium nitride alloys.

15. The method of claim 1, wherein fabricating said ferroelectric capacitor further includes patterning said conductive and ferroelectric material layers to respectively form electrodes and a ferroelectric layer of said ferroelectric capacitor.

16. The method of claim 1, wherein fabricating said ferroelectric capacitor further includes forming a photoresist layer on said organic bottom antireflective coating layer, and, then patterning said photoresist layer.

17. A method of manufacturing a ferroelectric memory cell, comprising:

forming one or more transistors on a semiconductor substrate;

depositing a pre-metal dielectric layer over said transistors;

fabricating a ferroelectric capacitor on said semiconductor substrate, wherein said ferroelectric capacitor is electrically coupled at least one of said transistors, said fabricating including:

forming conductive and ferroelectric material layers on said pre-metal dielectric layer;

forming a hardmask layer on said conductive and ferroelectric layers;

forming an organic bottom antireflective coating layer on said hardmask; and patterning said organic bottom antireflective coating layer, wherein seasoning in a hardmask etching chamber is substantially unaffected by said patterning.

18. The method of claim 17, wherein patterning said organic bottom antireflective coating layer further includes performing a plasma etch in said hardmask etching chamber using an atmosphere of seasoning-compatible etchant gases consisting essentially of $CF_4$, $CHF_3$ and $O_2$.

19. The method of claim 18, wherein patterning said organic bottom antireflective coating layer further includes:

performing a plasma etch in said hardmask etching chamber using an atmosphere that alters said seasoning; and performing a re-seasoning process in said hardmask etching chamber such that said seasoning is restored.

* * * * *